United States Patent
Offer et al.

(10) Patent No.: US 10,041,163 B1
(45) Date of Patent: Aug. 7, 2018

(54) PLASMA SPRAY COATING FOR SEALING A DEFECT AREA IN A WORKPIECE

(71) Applicant: GE-Hitachi Nuclear Energy Americas LLC, Wilmington, NC (US)

(72) Inventors: Henry Peter Offer, San Jose, CA (US); David Jonathan Keck, Wilmington, NC (US); Ronald Martin Horn, Sunol, CA (US)

(73) Assignee: GE-HITACHI NUCLEAR ENERGY AMERICAS LLC, Wilmington, NC (US)

( * ) Notice: Subject to any disclaimer, the term of this patent is extended or adjusted under 35 U.S.C. 154(b) by 0 days.

(21) Appl. No.: 15/423,954

(22) Filed: Feb. 3, 2017

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *C23C 4/134* | (2016.01) |

(Continued)

(52) U.S. Cl.
CPC ............ *C23C 4/134* (2016.01); *C23C 4/01* (2016.01); *C23C 4/18* (2013.01); *H01J 37/3233* (2013.01); *H01J 37/32889* (2013.01); *H01J 2237/3341* (2013.01)

(58) Field of Classification Search
None
See application file for complete search history.

(56) References Cited

U.S. PATENT DOCUMENTS

| | | | |
|---|---|---|---|
| 4,181,396 A | 1/1980 | Olashaw | |
| 4,292,785 A | 10/1981 | Hammond | |

(Continued)

FOREIGN PATENT DOCUMENTS

| | | |
|---|---|---|
| CN | 201055937 Y | 5/2008 |
| CN | 201055938 Y | 5/2008 |

(Continued)

OTHER PUBLICATIONS

Yin, Y., et al., Microstructure and Mechanical Properties of Underwater Friction Taper Plug Weld on X65 Steel with Carbon and Stainless Steel Plugs, *Science and Technology of Welding and Joining*, v. 21, n. 4, 2016, pp. 259-266.

(Continued)

*Primary Examiner* — Roberts Culbert
(74) *Attorney, Agent, or Firm* — Harness, Dickey & Pierce, P.L.C.

(57) ABSTRACT

A method for applying a coating to a defect area of a reactor component includes forming a patch on the reactor component at the defect area using a plasma-spray coating process. The plasma-spray coating process includes grounding the reactor component and a power supply of a plasma gun to a common ground such that a potential difference exists between the reactor component and a cathode of the plasma gun, and concurrently directing an ion-etching stream and a coating stream towards the region of the reactor component using the plasma gun while maintaining a desired distance between the plasma gun and the region of the reactor component. The directing the ion-etching stream includes heating the region of the reactor component using a plasma stream exiting a spray nozzle of the plasma gun. The coating stream includes droplets of a coating material.

18 Claims, 8 Drawing Sheets

(51) Int. Cl.
*C23C 4/01* (2016.01)
*H01J 37/32* (2006.01)
*C23C 4/18* (2006.01)

(56) References Cited

U.S. PATENT DOCUMENTS

| | | | |
|---|---|---|---|
| 5,469,617 A | 11/1995 | Thomas et al. | |
| 5,653,377 A | 8/1997 | Reatherford et al. | |
| 5,770,273 A | 6/1998 | Offer et al. | |
| 6,022,194 A | 2/2000 | Amos et al. | |
| 6,769,595 B2 | 8/2004 | Stol et al. | |
| 6,807,717 B2 | 10/2004 | Daehn | |
| 6,889,889 B2* | 5/2005 | Offer | B23K 9/0061 228/119 |
| 7,000,300 B2 | 2/2006 | Daehn | |
| 8,235,444 B2 | 8/2012 | Eidt et al. | |
| 8,397,939 B2 | 3/2013 | Landeck et al. | |
| 8,475,954 B2 | 7/2013 | Ljaz et al. | |
| 8,705,684 B2 | 4/2014 | Ortega et al. | |
| 9,067,279 B1 | 6/2015 | Shuaib et al. | |
| 9,115,504 B2 | 8/2015 | Wallance | |
| 9,117,940 B2 | 8/2015 | Rogers et al. | |
| 9,120,286 B2 | 9/2015 | Dailey | |
| 9,122,017 B2 | 9/2015 | Cottrell | |
| 9,122,035 B2 | 9/2015 | Stocklein | |
| 9,123,869 B2 | 9/2015 | Lee et al. | |
| 9,125,562 B2 | 9/2015 | Spencer et al. | |
| 9,125,679 B2 | 9/2015 | Larkin et al. | |
| 9,125,706 B2 | 9/2015 | Rabiner et al. | |
| 9,127,515 B2 | 9/2015 | Xu et al. | |
| 9,128,249 B2 | 9/2015 | Hasegawa et al. | |
| 9,128,256 B2 | 9/2015 | Miller | |
| 9,129,728 B2 | 9/2015 | Edbury et al. | |
| 9,130,091 B2 | 9/2015 | Keenihan et al. | |
| 9,130,223 B2 | 9/2015 | Rassat et al. | |
| 9,131,850 B2 | 9/2015 | Liu et al. | |
| 9,132,498 B2 | 9/2015 | Miller et al. | |
| 9,132,499 B2 | 9/2015 | Miller et al. | |
| 9,134,232 B1 | 9/2015 | Segall | |
| 9,138,181 B2 | 9/2015 | Haisley et al. | |
| 9,138,776 B2 | 9/2015 | Erretby et al. | |
| 9,138,786 B2 | 9/2015 | McKay et al. | |
| 9,138,822 B2 | 9/2015 | Miller et al. | |
| 9,139,468 B2 | 9/2015 | Donlagic et al. | |
| 9,139,989 B2 | 9/2015 | Meyers | |
| 9,140,018 B2 | 9/2015 | Southwell | |
| 9,140,050 B2 | 9/2015 | Lindgren et al. | |
| 9,140,867 B1 | 9/2015 | Sandate Aguilar et al. | |
| 9,140,872 B2 | 9/2015 | Sedor et al. | |
| 9,144,442 B2 | 9/2015 | Rabiner | |
| 9,144,954 B2 | 9/2015 | Xiang Li | |
| 9,149,980 B2 | 10/2015 | Cham et al. | |
| 9,155,492 B2 | 10/2015 | Jenkins et al. | |
| 9,155,553 B2 | 10/2015 | Zipnick | |
| 9,157,139 B2 | 10/2015 | Rajagopalan | |
| 9,157,167 B1 | 10/2015 | Pakalapati et al. | |
| 9,157,240 B2 | 10/2015 | Halischuk | |
| 9,161,684 B2 | 10/2015 | Seibel et al. | |
| 9,163,579 B2 | 10/2015 | Aharonov et al. | |
| 9,163,893 B1 | 10/2015 | Gutierrez | |
| 9,164,173 B2 | 10/2015 | Bridges et al. | |
| 9,168,775 B2 | 10/2015 | Zehetner et al. | |
| 9,169,872 B2 | 10/2015 | Sears et al. | |
| 9,170,388 B2 | 10/2015 | Baucom et al. | |
| 9,173,597 B2 | 11/2015 | Chinnayelka et al. | |
| 9,174,293 B2 | 11/2015 | Meyer et al. | |
| 9,175,418 B2 | 11/2015 | D'Evelyn et al. | |
| 9,175,464 B2 | 11/2015 | Meyers | |
| 9,175,931 B2 | 11/2015 | Leivesley et al. | |
| 9,176,342 B2 | 11/2015 | Ostergaard et al. | |
| 2009/0294514 A1 | 12/2009 | Babb et al. | |
| 2016/0180973 A1 | 6/2016 | Deaver et al. | |

FOREIGN PATENT DOCUMENTS

| | | |
|---|---|---|
| CN | 101244484 A | 8/2008 |
| CN | 101244485 A | 8/2008 |
| CN | 101439439 A | 5/2009 |
| CN | 101554681 A | 10/2009 |
| CN | 101798063 A | 8/2010 |
| CN | 101934426 A | 1/2011 |
| CN | 102950377 A | 3/2013 |
| CN | 202934234 U | 5/2013 |
| CN | 103212780 A | 7/2013 |
| CN | 103302396 A | 9/2013 |
| CN | 203875477 U | 10/2014 |
| CN | 203875478 U | 10/2014 |
| CN | 20407552 U | 1/2015 |
| CN | 104259653 A | 1/2015 |
| CN | 104308355 A | 1/2015 |
| CN | 204171533 U | 2/2015 |
| CN | 104400206 A | 3/2015 |
| CN | 104439685 A | 3/2015 |
| CN | 204183101 U | 3/2015 |
| GB | 1451447 A | 10/1976 |
| GB | 1473716 A | 5/1977 |
| GB | 1500975 A | 2/1978 |
| GB | 2257077 A | 1/1993 |
| GB | 2484602 A | 4/2012 |
| GB | 2502205 A | 11/2013 |
| JP | 2013108918 A | 6/2013 |
| WO | WO-2005/030419 A2 | 4/2005 |
| WO | WO-2005/684162 A2 | 9/2005 |

OTHER PUBLICATIONS

Blakemore, G. R., "Applications of State of the Art Portable Friction Welding Equipment," *Eurojoin 2: Second European Conference and Joining Technology*, Florence, Italy, May 16-18, 1994, pp. 127-136.

Nicholas, E. D., "Friction Welding When Applied to Hollow Sections," *Pipewelding*, London, England, Nov. 20-22, 1979, pp. 279-293.

Thomas, W. M., et al., "Friction Surfacing and New Methods of Friction Cladding," *Paton Welding Journal* (UK), v. 6, n. 3, 1994, pp. 179-185.

Meyer, A., et al., "Considerations on Robotic Friction Stitch Welding for the Repair of Marine Structures," *Proceedings of the International Conference on Offshore Mechanics and Arctic Engineering—OMAE*, v. 3, 2001, pp. 145-151.

Cui, L., et al., "Friction Taper Plug Welding for S355 Steel in Underwater Wet Conditions: Welding Performance, Microstructures and Mechanical Properties," *Materials Science and Engineering A*, v. 611, Aug. 12, 2014, pp. 15-28.

Reith, D., "Corrosion Control Using Portable Friction Welding," *Journal of Offshore Technology*, v. 11, n. 2, Mar./Apr. 2003, p. 46.

Nicholas, E. D., "Fabricating by Friction," *Engineering* (London), v. 225, n. 4, Apr. 1985, pp. 254-255.

Streeter, J., "Friction Welding Underwater: A Description of the Development, Process, and Future," *Proceedings of the International Offshore Mechanics and Arctic Engineering Symposium*, v. 5, 1988, pp. 361-364.

Dunkerton, S. B., et al., "Repair by Friction Welding," *Repair and Reclamation*, London, UK, Sep. 24-25, 1984, pp. 127-134.

Engineering Coating (Second Edition), Chapter 3: Weld Surfacing, pp. 42-118 (1998).

Shinoda, T., et al., "Surface Modification of 5083 Aluminum Alloys Using Friction Surfacing," *Journal of Japan Institute of Light Metals*, v. 49, n. 10, 1999, pp. 499-503.

Sharp, J. V., "Strengthening and Structural Repair of Ageing North Sea Platforms: A Review," *Proceedings of the International Conference on Offshore Mechanics and Arctic Engineering—OMAE*, 1993, pp. 863-868.

Gibson, D.E., et al., "Engineering Applications of Friction Stitch Welding," *Proceedings of the International Conference on Offshore Mechanics and Arctic Engineering—OMAE*, v. 3, 2001, pp. 139-143.

(56) References Cited

OTHER PUBLICATIONS

Wood, G.D., "Pipeline Incidents and Emergency Repair in the North Sea," *Journal of Energy Resources Technology, Transactions of the ASME*, v. 110, n. 4, Dec. 1988, pp. 219-223.

Blakemore, G. R., "Friction Welding—Technology for the New Millennium," *Proceedings of the Annual Offshore Technology Conference*, v. 1, 1999, pp. 851-859.

Bailey, N., "Welding Under Water—A Metallurgical Appraisal," *Proceedings of the First International Offshore and Polar Engineering Conference*, Edinburgh, UK, Aug. 11-16, pp. 331-338.

Andrews, R.E., et al., "Underwater Repair by Friction Stitch Welding," *Metals and Materials Bury St. Edmunds*, v. 6, n. 12, Dec. 1990, pp. 796-797. Li, J.Q., et al., "Underwater Friction Surfacing," *Surface Engineering* (UK), v. 16, n. 1, 2000, pp. 31-35.

Li, J. Q., et al., "Surface Modification by Friction Coating Under Water," *Materials Science Research International* (Japan), v. 6, n. 3, Sep. 2000, pp. 193-197.

Hynes, N. R. J. et al., "Mathematical Model to Predict Heat Flow in Underwater Friction Study Welding," *Advanced Materials Research*, v. 984-985, 2014, pp. 596-599.

Cotton, H.C., "Welding Under Water and in the Splash Zone—A Review," FWP Journal, v. 23, n. 10, Oct. 1983, pp. 7-14.

Li, J.Q., et al., "Underwater Friction Surfacing," Surface Engineering (UK), v. 16, n. 1, 2000, pp. 31-35.

\* cited by examiner

PLASMA SPRAY COATING FOR SEALING A DEFECT AREA IN A WORKPIECE

BACKGROUND

Field

The present disclosure relates to a plasma-spray coating method for sealing a defect area of workpiece (e.g., reactor component), an apparatus for performing the plasma-spray coating method, and/or a product including a patch formed using the plasma-spray coating method to cover a defect area of a workpiece.

Description of Related Art

Some structures that are typically submerged under a fluid may contain defect areas. Fluid may leak through the defect areas. For example, commercial nuclear power plants may have internal reactor components that contain defect areas such as cracks, openings, and gaps, and/or regions that include several defect areas. In nuclear reactors, core shrouds, steam pipes, and the like may contain through-thickness cracks caused by various Stress Corrosion Cracking (SCC), fatigue mechanisms, and design or fabrication flaws. During operation, fluid may leak through the defects area(s) of the reactor components due to a differential pressure across the defect area(s). The fluid leakage may present operational and regulatory issues.

A reactor component that includes defect area(s) may be highly activated and contaminated. Thus, draining the reactor fluid (e.g., core water) to perform general repairs may be impractical. Also, replacing reactor components may be costly. Accordingly, processes for repairing the defects area(s) and/or region(s) of reactor components without draining the reactor fluid of the reactor are being investigated.

SUMMARY

According to an example embodiment, a method for applying a coating to a defect area of a reactor component is provided. The method includes arranging a plasma gun to face a region of the reactor component that includes at least a portion of the defect area such that the plasma gun and the region of the reactor component are separated by a desired distance, and forming a patch on the reactor component at the defect area using a plasma-spray coating process. The plasma-spray coating process includes grounding the reactor component and a power supply of the plasma gun to a common ground such that a potential difference exists between the reactor component and a cathode of the plasma gun, and directing an ion-etching stream and a coating stream towards the region of the reactor component using the plasma gun while maintaining the desired distance between the plasma gun and the region of the reactor component. The directing the ion-etching stream and the coating stream are performed concurrently. The directing the ion-etching stream includes heating the region of the reactor component using a plasma stream exiting a spray nozzle of the plasma gun. The directing the coating stream includes transferring droplets of a coating material injected into the plasma gun to impinge the region of the reactor component.

According to an example embodiment, an apparatus for applying a coating to a defect area defined in a workpiece is provided. The apparatus includes an electromechanical device, a plasma gun connected to the electromechanical device, and a controller. The plasma gun includes a power supply, and a spray nozzle. The controller is configured to operate the plasma gun and to adjust a position of the plasma gun using the electromechanical device. The controller is configured to move the plasma gun to face a region of the workpiece that includes the defect area such that the plasma gun and the region of the workpiece are separated by a desired distance. The controller is configured to control the plasma gun and the electromechanical device to form a patch on the workpiece at the defect area using a plasma-spray coating process. The plasma-spray coating process includes grounding the workpiece and the power supply of the plasma gun to a common ground such that a potential difference exists between the workpiece and a cathode of the plasma gun, and directing an ion-etching stream, and a coating stream towards the region of the workpiece using the plasma gun while maintaining the desired distance between the plasma gun and the region of the workpiece. The directing the ion-etching stream and the coating stream are performed concurrently. The directing the ion-etching stream includes heating the region of the workpiece using a plasma stream exiting the spray nozzle of the plasma gun. The directing the coating stream includes transferring droplets of a coating material injected into the plasma gun to impinge the region of the workpiece.

According to an example embodiment, a modified part (e.g., modified reactor part) includes a workpiece defining a defect area and a patch mechanically and metallurgically bonded to a partial area of the workpiece at and nearby the defect area to cover the defect area. The defect area is one of a crack, an opening, or a gap defined in the workpiece. The patch includes at least one metal.

According to an example embodiment, a method for applying a coating on a workpiece using a plasma gun to reduce leakage through a defect area defined in the workpiece is provided. The method includes grounding the workpiece and a power supply of the plasma gun to a common ground such that a potential difference exists between the workpiece and a cathode of the plasma gun, arranging the plasma gun to face a region of the workpiece that is separated by a distance sufficiently short that the plasma gun is configured to generate a plasma stream that exits the plasma gun during plasma gun operation and will impinge directly on a surface of the region of the workpiece, ion etching the surface of the region of the workpiece by heating the surface with the plasma stream exiting a spray nozzle of the plasma gun to transform oxide-forming atoms on the surface of the region of the workpiece into positive ions, and splattering the surface of the region of the workpiece with droplets of a coating material injected into the plasma gun. The region of the workpiece includes at least a portion of the defect area. The distance separating the plasma gun and the workpiece is such that the positive ions leave the surface of the region of the workpiece under the influence of the potential difference between the region of the workpiece and the cathode. The ion etching and splattering the surface of the region of the workpiece is performed concurrently with maintaining the potential difference between the workpiece and the cathode.

BRIEF DESCRIPTION OF THE DRAWINGS

The various features and advantages of the non-limiting embodiments herein may become more apparent upon a review of the detailed description in conjunction with the accompanying drawings. The accompanying drawings are merely provided for illustrative purposes and should not be interpreted to limit the scope of the claims. The accompanying drawings are not to be considered as drawn to scale unless explicitly noted. For purposes of clarity, various dimensions of the drawings may have been exaggerated.

DETAILED DESCRIPTION

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, like reference numerals in the drawings denote like elements, and thus their description may be omitted.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 1:
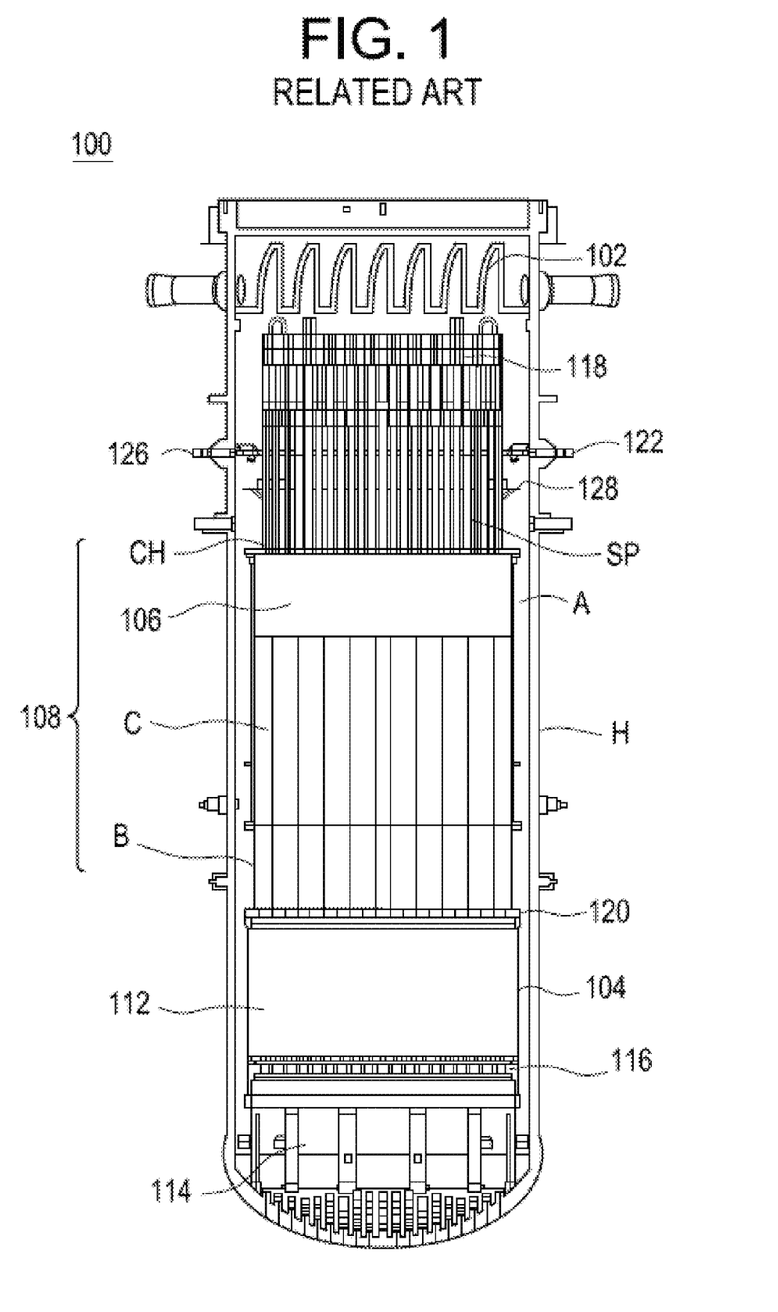
FIG. 1 illustrates an example of a nuclear reactor pressure vessel assembly.

FIG. 1 illustrates an example of a nuclear reactor pressure vessel assembly. A nuclear reactor pressure vessel assembly is described in U.S. patent application Ser. No. 14/577,364 (filed on Dec. 19, 2014) and U.S. application Ser. No. 14/751,690 (filed on Jun. 26, 2015). The entire contents of aforementioned applications are incorporated herein in by reference.

Referring to FIG. 1, the nuclear reactor pressure vessel assembly 100 may include a housing H that surrounds a core inlet region 114, a shroud 104, a reactor core 112, a chimney assembly 108, and steam separators 118. Although not shown, a top head may be connected to a top of the housing H. The housing H may be the vertical wall of the reactor pressure vessel assembly 100. The reactor core 112 is over the core inlet region 114. The chimney assembly 108 is between the steam separators 118 and the reactor core 112. The steam separators 118 are over the chimney assembly 108. The reactor core 112 may be defined by an inner surface of the shroud 104, a core plate 116 secured to a bottom of the shroud 104, and a top guide 120 secured to a top of the shroud 104. The shroud 104 may be a hollow cylindrical structure that separates the reactor core 112 from the downcomer annulus flow in the annulus A. The core plate 116 may support control rods and fuel assemblies that include a plurality of fuel rods in the reactor core 112.

The chimney assembly 108 includes a chimney barrel B, chimney partitions C, a chimney head CH, and a plenum 106. An inner surface of the chimney barrel B defines a space between the reactor core 112 and the steam separators 118. Chimney partitions C divide the space defined by the inner surface of the chimney barrel B into smaller sections.

The annulus A is a space between the housing H and outer surfaces of the chimney assembly 108 and reactor core 112. Together, an inner surface of the chimney assembly 108 and an inner surface of the reactor core 112 define a conduit for transporting a gas-liquid two phase flow stream from the reactor core 112 through the chimney assembly 108 to the steam separators 118.

A steam dryer 102 may be connected on top of the steam separators 118. Steam separation occurs as the gas-liquid two phase flow stream enters the steam separators 118. The reactor pressure vessel assembly 100 includes at least one feedwater sparger 126 in the housing H that is configured to deliver a subcooled feedwater into the annulus A. A feedwater nozzle 122 may be connected to each feedwater sparger 126 through the feedwater opening defined in the housing H. A support plate 128 may be secured to the chimney head CH.

Figure 2A:
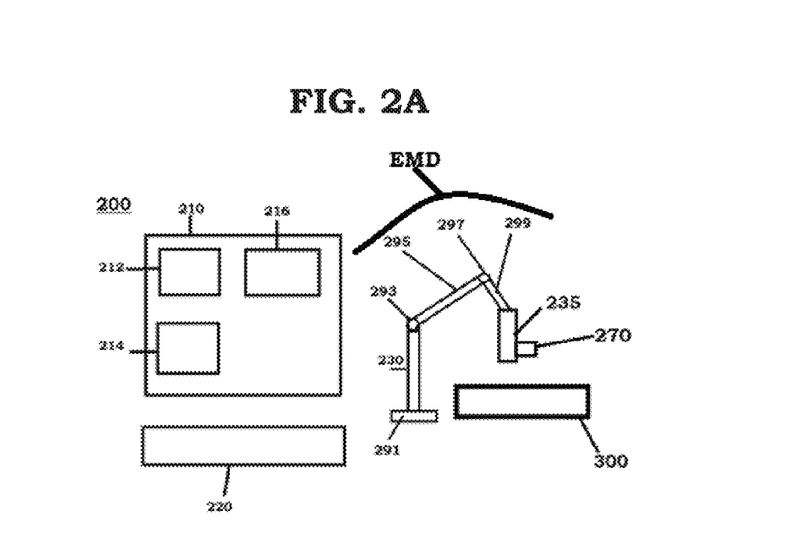
FIG. 2A illustrates an apparatus for applying a coating to a defect area defined in a workpiece according to an example embodiment.
Figure 2B:
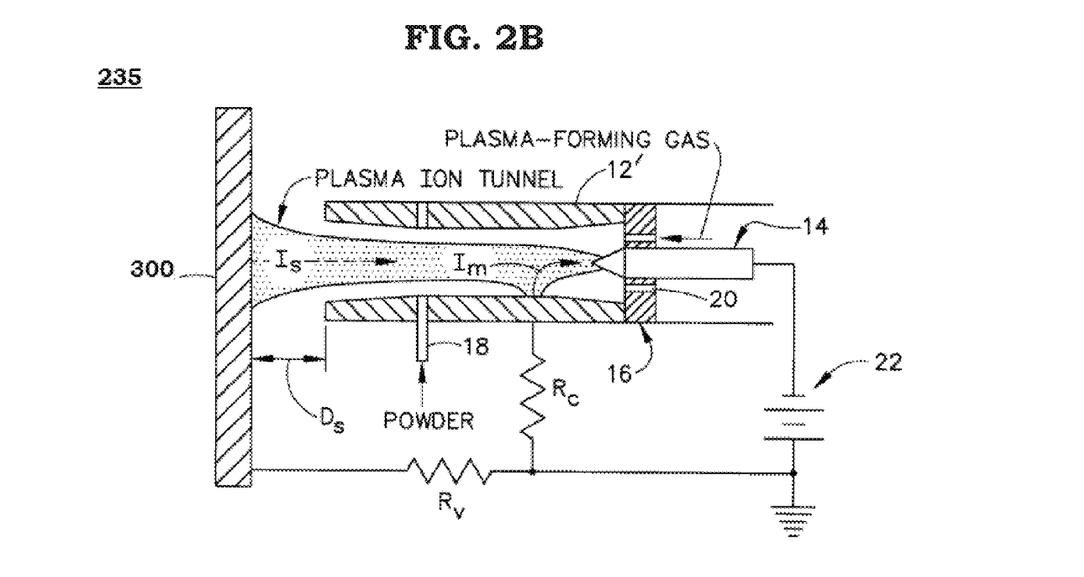
FIG. 2B is a schematic diagram that illustrates an example of a plasma gun.

FIG. 2A illustrates an apparatus for applying a coating to a defect area defined in a workpiece according to an example embodiment. FIG. 2B is a schematic diagram that illustrates an example of a plasma gun.

Referring to FIG. 2A, according to an example embodiment, an apparatus 200 for applying a coating to a defect area defined in a workpiece 300 is provided.

The plasma coating apparatus 200 may include a controller 210, an electromechanical device EMD, an input/output device 220 such as a keyboard and display, a securing structure 230, a plasma gun 235, an instrument 270, and a base 291. The controller 210 may include a processor 212, a memory 214, and a power supply 216. The processor 212 may be embodied as hardware, such as a microcontroller, a central processing unit, and/or an application specific integrated circuit. The memory 214 may be a nonvolatile memory (e.g., flash memory) or a volatile memory (e.g., DRAM), or a combination thereof. The controller 210 may direct commands and power from the power supply 216 for controlling operations of various structures of the plasma coating apparatus 200.

The securing structure 230 may connect to the base 291. In the plasma coating apparatus, the electromechanical device EMD may include a robotic arm that includes a plurality of connecting members (e.g., 293 and 297) and a plurality of elongate members (e.g., 295 and 299). The base 291 may be configured to rotate the securing structure 230 to adjust a position the robotic arm relative to the workpiece 300. The connecting members include a first connecting member 293 for raising and lowering a first elongate member 295 and a second connecting member 297 for raising and lowering a second elongate member 299. Each of the base 291, first connecting member 293, and second connecting member 297 may be embodied to include an actuator (e.g., servo motor) for rotating and moving the securing structure 230, first elongate member 295, and second elongate member 299, respectively. The power supply 216 in the controller 210 may be connected to the plasma gun 235, electromechanical device EMD, processor 212, and memory 214.

The controller 210 may control the instrument 270 for determining a location of defects in the defect area of the workpiece 300 and/or sizes of defects in the defect area. The instrument 270 may include a defect-inspection camera for identifying locations of the defects in the defect area, sizes of defects in the defect area, and/or an ultrasonic sensor for identifying information related to the depths of defects in the defect area. The controller 210 may receive defect information from the instrument 270 that corresponds to locations and/or sizes of the defects in the defect area of the workpiece 300. The controller 210 may control the electromechanical device EMD and the plasma gun 235 to form patches on selected defects in the workpiece 300 (or a region including the defect area in the workpiece 300) based on the corresponding locations and/or sizes of the defects provided in the defect information.

Referring to FIGS. 2A and 2B, an example of the plasma gun 235 of the plasma coating apparatus is illustrated. A plasma gun is described in U.S. Pat. No. 5,770,273, the entire contents of which are incorporated herein by reference. The plasma gun 235 may be part of a plasma gun system. The plasma gun 235 may be connected to the electromechanical device EMD of the plasma coating apparatus 200. For example, the plasma gun 235 may be connected to the second elongate member 299. The plasma gun 235 includes an anode 12', a cathode 14 arranged coaxial with the anode 12', a gas diffuser 16 that has a plurality of gas injectors 20, one or more powder injectors 18 that penetrate the anode 12', and a dc power supply 22. The gas injectors 20 may be supplied with at least one plasma-forming gas (e.g., argon, helium, nitrogen, and/or mixtures thereof), which may be effectively inert. The anode 12' may be formed in the shape of a spray nozzle, and may be referred to as an anodic spray nozzle. The anode 12' and cathode 14 may each be formed of copper. The anode 12' and cathode 14 may also be referred to as an anodic electrode and a cathodic electrode. The anode 12' may be lined with tungsten. The resistance of the anode cable is indicated by Rc. The workpiece 300 may be connected via a cable having resistance Rv to the same ground that the DC power supply 22 is connected to. During operation, this sets up a potential difference between the workpiece 300 and the cathode 14.

The controller 210 of the plasma coating apparatus may be configured to operate the plasma gun 235 and to adjust a position of the plasma gun 235 using the electromechanical device EMD. The controller 210 may be configured to move the plasma gun 235 to face a region of the workpiece 300 that includes the defect area such that the plasma gun and the region of the workpiece 300 are separated by a desired distance Ds. The desired distance Ds may be in a range of about 10 mm to about 20 mm, but is not limited thereto. The controller 210 is configured to control the plasma gun 235 and the electromechanical device EMD to form a patch on the workpiece 300 at the defect area using a plasma-spray coating process.

The plasma-spray coating process may include grounding the workpiece 300 and the power supply 22 of the plasma gun 235 to a common ground such that a potential difference exists between the workpiece 300 and the cathode 14 of the plasma gun 235 during operation, and concurrently directing an ion-etching stream and a coating stream towards the region of the workpiece 300 that includes the defect area using the plasma gun 235 while maintaining the desired distance Ds between the plasma gun 235 and the region of the workpiece 300. The directing the ion-etching stream includes heating the region of the workpiece 300 using a plasma stream exiting the anode 12 formed in the shape of a spray nozzle. The directing the coating stream includes transferring thermally-softened and/or molten droplets of a coating material injected into the plasma gun 235 to impinge and bond to the region of the workpiece 300. The thermally softened and/or molten droplets of the coating material may be formed from metal and/or metal alloy Powder injected through the powder injectors 18. The plasma formed in the plasma gun 235 may transform the Powder into thermally-softened and/or molten droplets of the coating material. Although not illustrated, a coating material feeder may be connected to the powder injectors 18 for supplying the coating material to the powder injectors 18. The coating material feeder may include a hopper and/or any suitable hardware material feeder.

The controller 210 may be configured to control the electromechanical device EMD and the plasma gun 235 to form the patch in the shape of a pattern that covers a defect in the defect area or covers a region of the workpiece 300 that includes the defect area. For example, the controller 210 may move the plasma gun 235 so the plasma gun 235 faces the defect area in the workpiece 300 (or a region of the workpiece 300 that includes the defect area) and is separated from the workpiece 300 by the desired distance Ds. Then, the controller may control the plasma gun 235 to form the patch over the defect area in the workpiece 300 (or region of the workpiece that includes the defect area) using the plasma-spray coating process. In forming the patch over the defect area, the controller 210 may control the plasma gun 235 and the electromechanical device EMD to form a series of overlapping coating spots or traverse the defect area to apply overlapping coating beads. The plasma gun 235 in FIG. 2B is merely a non-limiting example. One of ordinary skill in the art would recognize that the plasma gun 235 in the plasma coating apparatus 200 is not limited to the example shown in FIG. 2B.

Figure 2C:
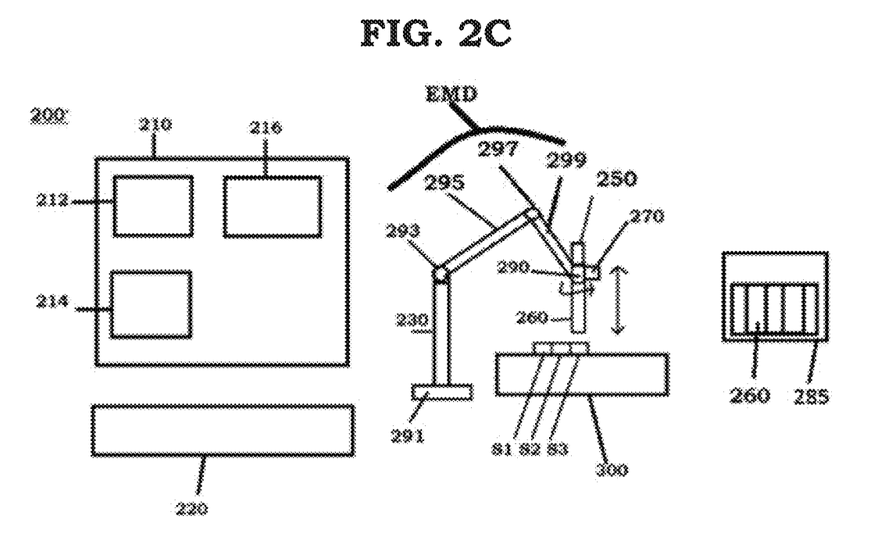
FIG. 2C illustrates an apparatus for performing friction-spot sealing according to an example embodiment.

FIG. 2C illustrates an apparatus for performing friction-spot sealing according to an example embodiment. An apparatus for performing friction-spot sealing is described in U.S. application Ser. No. 15/423,899 titled "FRICTION SPOT SEALING OF A DEFECT AREA IN A WORKPIECE," filed concurrently herewith, the entire contents of which are incorporated by reference. For ease of description, features that are the same as or similar to the apparatus 200 in FIG. 2A may be omitted and/or described in less detail.

Referring to FIG. 2C, according to an example embodiment, an apparatus 200' for performing friction-spot sealing to reduce leakage through a defect area defined in a workpiece 300 is provided. The friction-spot sealing apparatus 200' may include a controller 210, an input/output device 220, an electromechanical device EMD, a motor 250, a consumable structure storage 285 for storing used and/or unused consumable structures 260, an instrument 270, and a coupling structure 290. The controller 210 may control the instrument 270 to determine a location of defects in the defect area of the workpiece 300 and/or sizes of defects in the defect area. The motor 250 may be a fluid-powered motor, pressure-powered motor, an AC-powered motor, or a DC-powered motor. The motor 250 may be configured to at least one of rotate and oscillate the consumable structure 260. The electromechanical device EMD may include a robotic arm. The robotic arm may include elongate members (e.g., 295 and 299) joined by connecting members (e.g., 293 and 297).

The coupling structure 290 may couple the consumable structure 260 to the motor 250. The coupling structure 290 may be connected to the electromechanical device EMD, such as the second elongate member 299. In order to secure the consumable structure 260, the coupling structure 290 may operate in a manner that is the same as or similar to how a drill bit holder secures a drill bit and/or may be disengaged for removing a drill bit. When a consumable structure 260 is used up, the consumable structure 260 may be removed and the coupling structure 290 may secure a different consumable structure 260 that is new or at least is suitable for use. The coupling structure 290 may be embodied as a chuck, but is not limited thereto. The coupling structure 290 may be disengaged to unsecure the consumable structure 260 from the robotic arm. The motor 250 and instrument 270 may be connected to the coupling structure 290. The motor 250 may be configured to at least one of rotate and oscillate the consumable structure 260.

The controller 210 may be configured to control the motor 250, base 291, and the electromechanical device EMD to form spot material portions (e.g., S1, S2, S3) on the workpiece 300. The spot material portions (e.g., S1, S2, S3) may be formed on the workpiece 300 at the defect area without using a fusion welding process. Each one of the plurality of spot material portions (e.g., S1, S2, S3) may overlap at least one other spot material portion among the plurality of spot material portions. The controller 210 may be configured to control the motor 250 and the electromechanical device EMD to form the plurality of spot material portions on the workpiece 300 (e.g., reactor component) by friction-sealing parts of the consumable structure 260 to different parts of the workpiece 300 (e.g., reactor component). The controller 210 may control the motor 250 and the electromechanical device EMD to form the plurality of spot material portions (e.g., S1, S2, S3) on the workpiece 300 in a pattern that overlaps the defect area or covers a region of the workpiece 300 that includes the defect area. The spot material portions may be generated only from the substrate, or only from the consumable filler material, or from a combination of both sources.

The apparatus for friction-spot sealing 200' may be configured to move the coupling structure 290 in different directions of an x-y-z rectilinear or a R-Θ-Z polar coordinate system. The base 291 may rotate the securing structure 230 to adjust a position of the electromechanical device EMD, and consumable structure 260 connected to the coupling structure 290, relative to the workpiece 300. When the consumable structure 260 is connected to the coupling structure 290, the apparatus for friction-spot sealing 200' may use the electromechanical device EMD to raise and lower the consumable structure 260 in a z-direction in order to press the consumable structure 260 against different locations of the workpiece 300 while the consumable structure 260 is at least one of rotating and oscillating. The apparatus for friction-spot sealing 200' may also use the electromechanical device EMD to retract the consumable structure 260 away from workpiece 300 and reposition the consumable structure 260 in the x-direction and/or y-direction to face different locations of the workpiece 300.

Forming a spot material portion by friction-sealing may include pressing the consumable structure 260 against a position of the workpiece 300 (e.g., reactor component) using a pressure, a contact time, a rotational speed, and a motion speed of the consumable structure 260 that are sufficient to plasticize a part of the consumable structure 260 without heating the consumable structure 260 above a melting point of the workpiece 300. The motion speed may correspond to one of a rotational speed, a rotational oscillation frequency, and a linear oscillation frequency. After the consumable structure 260 is pressed against the workpiece 300 for the contact time while at least one of rotating and oscillating the consumable structure, the consumable structure 260 may be temporarily moved away from the workpiece 300 to limit and/or prevent the consumable structure 260 from being permanently welded to the workpiece 300.

The consumable structure 260 may include the same material as a material of the workpiece 300. Alternatively, the consumable structure 260 and the workpiece 300 may be formed of different materials, or the consumable structure 260 may include at least one material that is not included in the workpiece 300. The consumable structure 260 may have a rod shape and a diameter in a range of 1 mm to 25 mm, but is not limited thereto. A length of the consumable structure may be in a range from 50 mm to 250 mm and/or in a range of 75 mm to 225 mm, but is not particularly limited.

The consumable structure 260 may include at least one metal and/or metal alloy. The metal and/or metal alloys may include at least one ductile metal. Numerous base metal and metal alloys can be used for the consumable structure 260 as long as the material(s) of the consumable structure 260 is metallurgically compatible with the material(s) of the workpiece 300 in the hot, plasticized but solid state material phase during the friction-sealing a spot material portion. Friction-sealing a part of the consumable structure 260 onto the workpiece 300 to form a spot material portion on the workpiece 300 may be performed at a lower temperature than fusion welding the consumable structure 260 to the workpiece 300. This is because friction-sealing a part of the consumable structure 260 to the workpiece 300 does not require melting the consumable structure 260 or workpiece 300. In contrast, fusion welding relies on heating and melting two materials to join them together. In further contrast, brazing and soldering may require that the filler metal become molten to form a joint after cooling. Thus, with friction-sealing, metallurgical compatibility between the consumable structure and the workpiece is easier to achieve than for fusion welding where detrimental microstructures can form on cooling from the liquid state and lead to various kinds of hot cracking and solidification cracking when cooled. Because the friction-sealing process does not melt the workpiece 300, the friction-sealing process is not susceptible to He-induced cracking in a highly irradiated workpiece 300 such as a reactor component. In contrast, when a fusion welding process is used, the fusion welding process may cause He-induced cracking in a highly irradiated workpiece 300 such as a reactor component because the fusion welding process operates at a higher temperature that melts the workpiece.

The consumable structure 260 may further include at least one noble metal (e.g., Cu, Ru, Rh, Pd, Ag, Re, Os, Ir, Pt, Au, Hg). Noble metals, such as Pd or Pt and/or other noble metals, may reduce crack growth in the workpiece 300 from stress corrosion cracking (SCC). The addition of noble metals, such as Pd or Pt, to the consumable structure 260 may improve the resistance of a spot material portions formed from the consumable structure 260 to SCC. If the workpiece 300 is a nuclear reactor component, the radiolysis of water forms oxygen and hydrogen, and the oxidizing species therefrom promote intergranular stress corrosion cracking (IGSCC). However, noble metals, such as Pd or Pt, provide resistance to SCC because noble metals act as a surface catalyst for more efficient recombination of hydrogen and oxygen (present from the radiolytic decomposition of the reactor coolant water). The consumable structure 260 may further include a composition forming a ferrite microstructural phase to increase hot cracking resistance and/or SCC resistance of spot material portions (e.g., S1 to S3) formed on the workpiece 300.

The workpiece 300 may be a reactor component such as any one of the internal reactor components (e.g., shroud, steam separator) in the reactor pressure vessel assembly 100 described in FIG. 1 of the present application, but is not limited thereto. The workpiece 300 may be a part of a ship hull, an offshore drilling structure, a nautical vessel, and the like. The defect area may have extremely limited access to repair equipment, or insufficient access by repair personnel. The workpiece 300 may include at least one of stainless steel (e.g., 304/L, 308/L, 309/L, 312/L, 316/L, 321/L, 347/L, etc.), carbon steel, nickel-based alloys (52, 132, 182, 600, etc.), nickel-based steel, low-alloy steel, chromium-based steel, and austenitic or duplex steel but is not limited thereto. When the workpiece 300 is an internal reactor part of a nuclear reactor, the workpiece 300 may be a highly-irradiated part. A highly-irradiated part may have negligible helium (He) content of about 0 atomic weight percent before being used in a nuclear reactor, but may develop a helium (He) content of about 1 to about 3 atomic weight percent, or greater, after being used in the nuclear reactor, such as by transmutation of Boron. However, the workpiece 300 may be formed of other materials depending on the application of the workpiece 300. For example, in some example embodiments, the workpiece 300 may include thermoplastic composites and polymers.

FIGS. 3A, 3B, 3C, and 3D illustrate a gap defect area in a workpiece, a crack defect area in a workpiece, an opening defect area in a workpiece, and a region including a defect area in a workpiece. The workpieces 300 in FIGS. 3A to 3D and 4A to 4D may be submerged under a liquid L, such as water or a water-steam mixture.

Figure 3A:
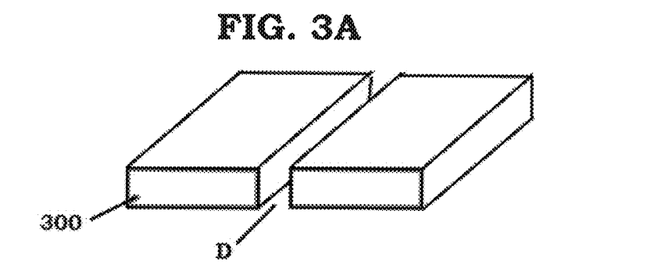
FIGS. 3A, 3B, 3C, and 3D illustrate a gap defect area in a workpiece, a crack defect area in a workpiece, an opening defect area in a workpiece, and a region including a defect area in a workpiece.
Figure 3B:
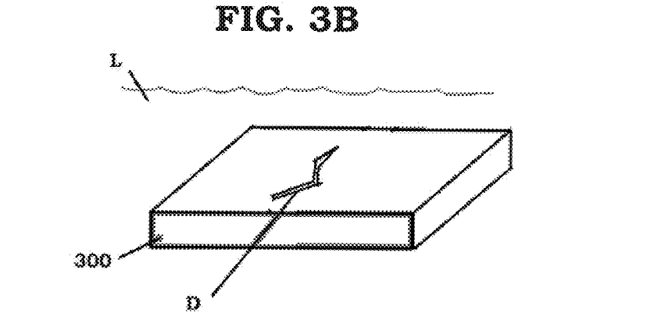
Figure 3C:
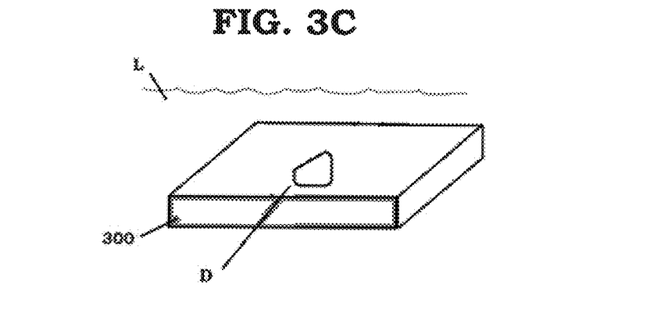
Figure 3D:
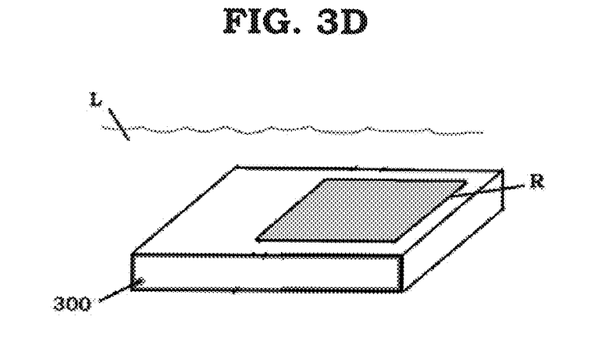

FIG. 3A illustrates an example where the defect area D is a gap in the workpiece 300. Although the defect area in FIG. 3A is a gap with a linear pattern, one of ordinary skill in the art would recognize that the gap may have a different shape and/or variable width. FIG. 3B illustrates an example where the defect area D is a crack in the workpiece 300. The crack may have a depth that is less than the thickness of the workpiece 300, or the crack may extend through an entire thickness in at least part of the workpiece 300. FIG. 3C illustrates an example where the defect area D is an opening defect area (e.g., hole) in the workpiece 300. FIG. 3D illustrates an example where the workpiece 300 includes a region R that includes the defect area. The region R may include a greater number of defects (or greater defect density) than a different location of the workpiece 300 outside of region. The workpiece 300 may include any combination of the gap, crack, opening, and region in FIGS. 3A to 3D.

Figure 4A:
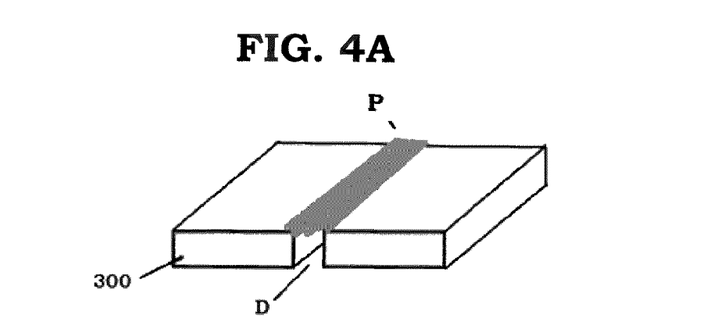
FIGS. 4A to 4D illustrate the workpieces in FIGS. 3A to 3D after being treated using a plasma-spray coating process according to an example embodiment.
Figure 4B:
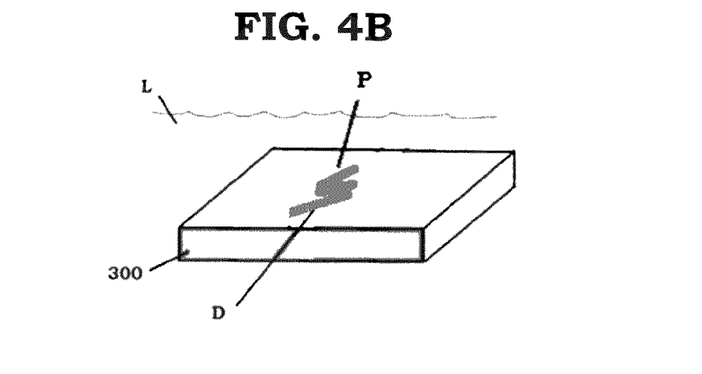
Figure 4C:
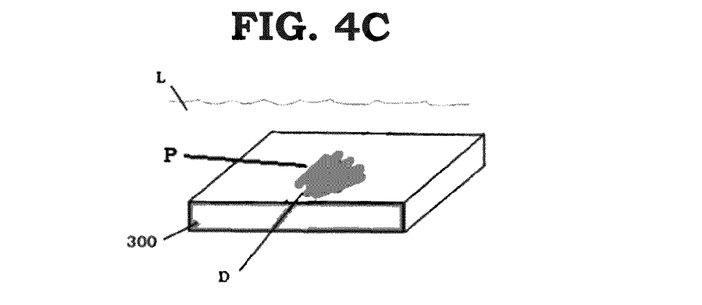
Figure 4D:
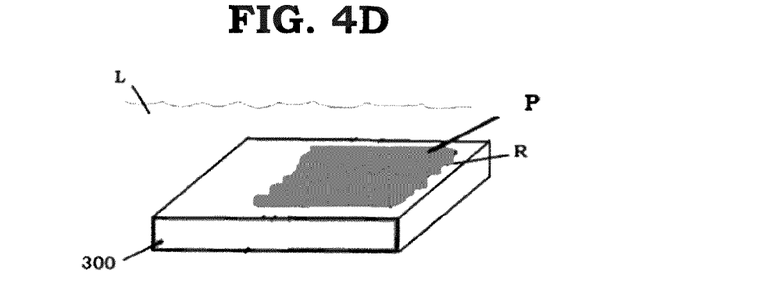
Figure 5:
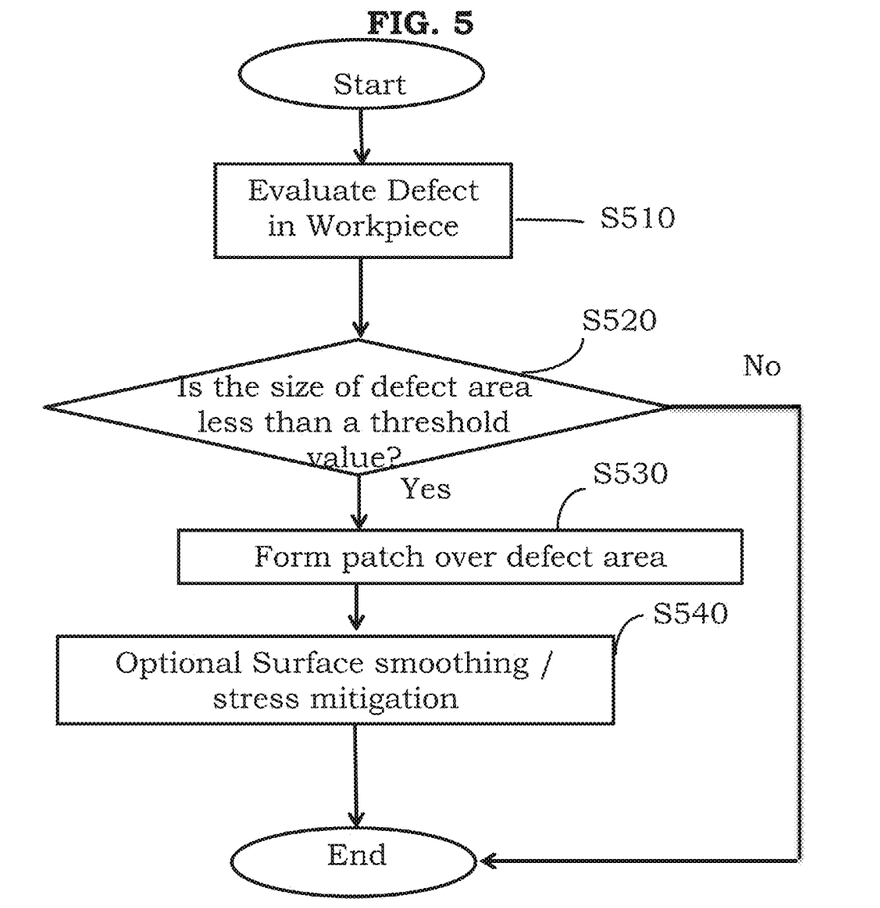
FIG. 5 is a flow chart illustrating operations of a method of applying a coating to a defect area of a workpiece according to an example embodiment.

FIGS. 4A to 4D illustrate the workpieces in FIGS. 3A to 3D after being treated using a plasma-spray coating process according to an example embodiment. The workpieces 300 in FIGS. 3A to 3D and 4A to 4D may be submerged under a liquid L, such as water or a water-steam mixture. Alternately, local dry environments may be temporarily established around the defect area to facilitate the coating process, such as to require less energy to bring at least one of the substrate or sealing metals to a plastic temperature range, or to improve the seal bonding and microstructure. FIG. 5 is a flow chart illustrating operations of a method of applying a coating to a defect area of a workpiece according to an example embodiment.

Referring to FIG. 5, in operation S510, the workpiece may be examined visually or examined with the aid of an instrument such as a camera and/or ultrasonic testing equipment to evaluate whether the workpiece includes at least one defect area. Operation S510 may be performed using the instrument 270 of the apparatus 200 in described in FIG. 2A (or the instrument 270 in the apparatus 200' described in FIG. 2C), but is not limited thereto. For example, an operator (e.g., diver or remote equipment technician) could use a separate instrument such as a camera and/or ultrasonic tester to examine the workpiece for at least one defect area according to operation S510.

If the workpiece includes a defect area, in operation S520, then a dimension of the defect area such as a size (e.g., width, length, diameter) and/or a thickness of the defect area may be compared to a threshold value. The threshold value may be correspond to a maximum size of the defect area that can be covered with a patch. The threshold value may be determined based on design considerations and/or empirical study, but is not limited thereto. The processor 212 of the controller 210 in the apparatus 200 in FIG. 2A (or apparatus 200' in FIG. 2C) may be configured to compare the dimension of the defect area to the threshold value. If the dimension of the defect area is greater than or equal to the threshold value, then a patch may not be formed over the defect area and the method may bypass operations S530 and S540.

If the dimension of the defect area is less than the threshold value, then a patch may be formed over at least part of the defect area in workpiece. The patch may be formed without using a fusion welding process. The patch may be formed while the workpiece including the defect area is underwater, or otherwise not directly visible. In operation S530, the patch may be formed by arranging the plasma gun 235 described in FIGS. 2A and 2B to face a region of the workpiece (e.g., reactor component) that includes at least a portion of the defect area such that the plasma gun 235 and the region of the workpiece are separated by a desired distance. As shown in FIG. 2B, the desired distance Ds may correspond to a separation distance between the workpiece 300 and the anode 12' of the plasma gun 235.

Next, a patch may be formed on the workpiece 300 (e.g., reactor component) at the defect area using a plasma-spray coating process. The patch P may be formed on the workpiece 300 to have a pattern that corresponds to a shape of the defect area or region in the workpiece. FIGS. 4A to 4D illustrate examples where the patch P is formed over a defect area D corresponding to a gap (see FIG. 3A), a crack (see FIG. 3B), an opening (see FIG. 3C), or a region R (see FIG. 3D) in the workpiece 300. A thickness of the patch P may be in a range of 0.1 mm to 10.0 mm (and/or 1.0 mm to 6.0 mm). Thicker patches may be used according to the pressure-retaining or strength needs of the patch. For sufficiently high strength requirements, a combination of a thick plasma-spray patch and a friction-welded patch attachment method can be used, where the friction process provides a substantial portion of the bond strength, and the plasma sealing process provides a substantial portion of the patch thickness. A width of the patch may be in a range of 1 mm to 250 mm. Each patch P may only cover a partial area of a surface of the workpiece 300 that corresponds to the defect area D or region R in the workpiece 300. Overlapping or spaced patches may be used in a general defect area to increase the effective size of the repair. For example as shown in FIGS. 4A to 4C, portions of the workpiece 300 that are not adjacent to the defect area D may not be covered by the patch P. Similarly, as shown in FIG. 4D, portions of the workpiece 300 that are not adjacent to the region R may not be covered by the patch P. The patch P includes sufficient thickness, bonding, ductility, and strength so that it can seal the defect area D or region R in the workpiece 300. Thus, leakage through the defect area D may be reduced or eliminated, and/or the growth of the region R may be limited, by forming the patch P over the defect area D or region R.

Referring to FIG. 2B, the plasma-spray coating process for forming the patch P may include grounding the workpiece 300 and a power supply 22 of the plasma gun 235 to a common ground such that a potential difference exists between the workpiece 300 and a cathode 14 of the plasma gun 235, arranging the plasma gun 235 to face a region of the workpiece 300 that is separated by a distance sufficiently short that the plasma gun is configured to generate a plasma stream that exits the plasma gun 235 during plasma gun operation, ion etching the surface of the region of the workpiece 300, and splattering the surface of the region of the workpiece 300 with thermally-softened and/or molten droplets of coating material injected into the plasma gun 235. The plasma stream will impinge directly on a surface of the region of the workpiece 300 that includes at least a portion of the defect area. The ion etching the surface of the region of the workpiece 300 may include heating the surface with the plasma stream exiting a spray nozzle of the plasma gun 235 to transform oxide-forming atoms on the surface of the region of the workpiece 300 into positive ions to improve bonding with the patch. The distance Ds separating the plasma gun and the workpiece 300 may be controlled such that the positive ions leave the surface of the region of the workpiece 300 under the influence of the potential difference between the region of the workpiece 300 and the cathode 14. The distance Ds may sufficiently short (e.g., about 10 mm to about 20 mm) such that surrounding liquid or its vapor, if present, does not become substantially entrained in the plasma stream. The ion etching and splattering the surface of workpiece 300 may be performed concurrently with maintaining the separation distance Ds and/or potential difference between the workpiece 300 and the cathode 14.

The plasma-spray coating process may form a patch P that is at least partially metallurgically bonded and/or at least partially mechanically bonded to a partial area of the workpiece at and nearby the defect area to cover the defect area. Increased metallurgical bonding can occur when the plasma coating method is combined with a friction sealing method. Mechanical bonding generally also takes place when the substrate is prepared with an anchor-profile surface finish. The patch may be formed from a coating material, based on the powder supplied to the powder injector 18 of the plasma gun. The coating material may include at least one metal. The coating material may include at least one noble metal. (e.g., Cu, Ru, Rh, Pd, Ag, Re, Os, Ir, Pt, Au, Hg). Noble metals, such as Pd or Pt and/or other noble metals, may reduce crack growth in the workpiece 300 from stress corrosion cracking (SCC). The addition of noble metals, such as Pd or Pt, to the coating material may improve the resistance of a patch formed from the coating material to SCC. In an example embodiment, the coating material may include an Alloy 82 powder (e.g., a Ni—Cr—Fe metal alloy) that includes a noble metal (e.g., Pt or Pd) in a range that is greater than 0% and less than about 1% by weight. Other nickel-based alloys (e.g., Alloy 600, 625, and 690) doped with less than 1% noble metal may be used as the coating material. If the workpiece 300 is a nuclear reactor component, the radiolysis of water forms oxygen and hydrogen, which promote intergranular stress corrosion cracking (IG-SCC). However, noble metals, such as Pd or Pt, provide resistance to SCC because noble metals act as a surface catalyst for more efficient recombination of hydrogen and oxygen (present from the radiolytic decomposition of the reactor coolant water). The coating material may further include ferrite phase to increase hot cracking resistance and/or SCC resistance of the patch formed on the workpiece 300.

The patch P may be formed on the workpiece 300 (e.g., reactor component such as shroud) without using a fusion-welding process and/or without forming a gas shroud. Forming a patch P on a part of the workpiece 300 using a plasma-spray coating process may be performed at a lower temperature than fusion welding a coating material to the workpiece 300. This is because the plasma coating process does not require melting the workpiece 300. The ion-etching stream of the plasma-spray coating process may heat the workpiece 300 to a temperature below a melting point of the workpiece 300. In contrast, fusion welding relies on heating and melting two materials to join them together. Thus, with the plasma coating process, metallurgical compatibility between the coating material of the patch and the workpiece is easier to achieve than for fusion welding where detrimental microstructures can form on cooling from the liquid state and lead to various kinds of hot cracking and solidification cracking when cooled. For example, because the plasma coating process does not melt the workpiece 300, the plasma coating process is not susceptible to He-induced cracking in a highly irradiated workpiece 300 such as a reactor component. In contract, when a fusion welding process is used, the fusion welding process may cause He-induced cracking in a highly irradiated workpiece 300 such as a reactor component because the fusion welding process operates at a higher temperature that melts the workpiece.

In operation S530, the patch may be formed using the plasma gun 235 of the apparatus 200. However, one of ordinary skill in the art would appreciate that operation S530 may be performed using various types of machines. For example, an operator (e.g., diver) could position and operate the plasma gun 235 to form the patch P on the workpiece 300 using a plasma-spray coating process.

In operation S540, an optional surface smoothing and/or stress mitigation process may be performed on the patch formed on the workpiece. The surface smoothing and/or stress mitigation process may include improving a surface finish of the patch using one of a sanding process, an abrasive brushing process and a surface-treatment process. Operation S540 may be performed using General Electric's ReNew™ Surface Improvement process. The ReNew™ Surface Improvement process mechanically conditions metals at weld areas to reduce the formation and/or growth of small cracks due to tensile surface stresses and/or stress corrosion cracking.

After operation S540, or S530 if operation S540 is omitted, the workpiece may be examined to check if the patch formed in operation S530 covers the defect area of the workpiece. If the defect area is covered by the patch, then the method of applying a coating to a defect area of a workpiece may be complete. However, if the workpiece includes another defect area, then the method of applying a coating to a defect area of a workpiece may be performed to cover the other defect area of workpiece. On the other hand, if the patch does not fully cover the defect area of the workpiece, then another patch may be formed according to operations S510 to S540 again on another part of the workpiece that overlaps part of the defect area.

Figure 6A:
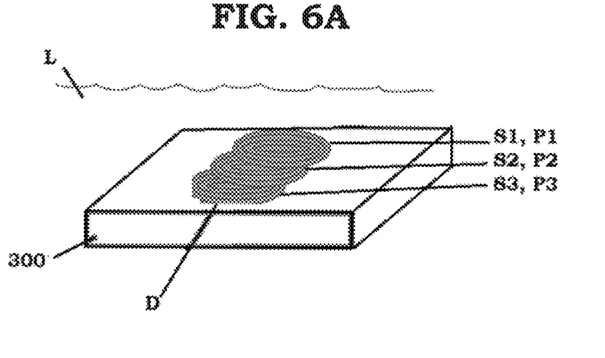
FIG. 6A illustrates a primer layer including spot material portions formed on a defect area using a friction-spot sealing process according to an example embodiment.
Figure 6B:
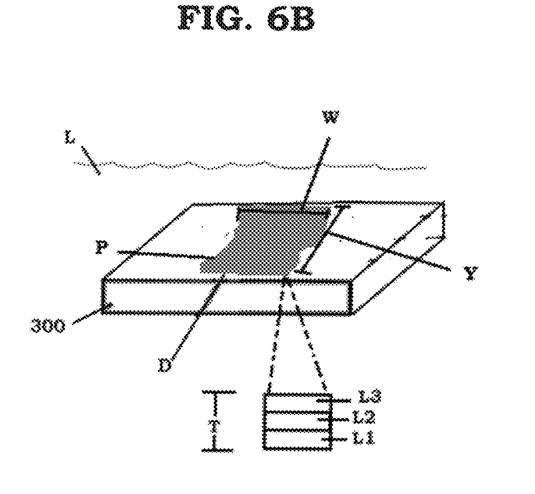
FIGS. 6B and 6C illustrate a patch including a plurality of layers according to an example embodiment.
Figure 6C:
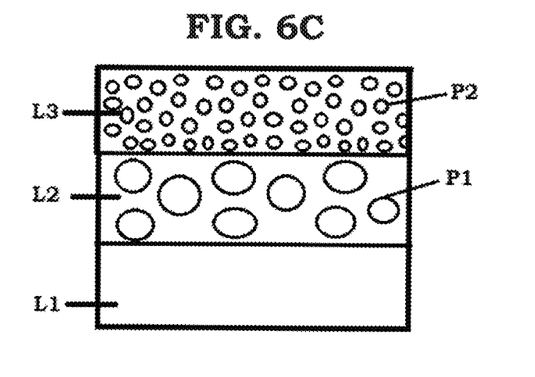
Figure 7:
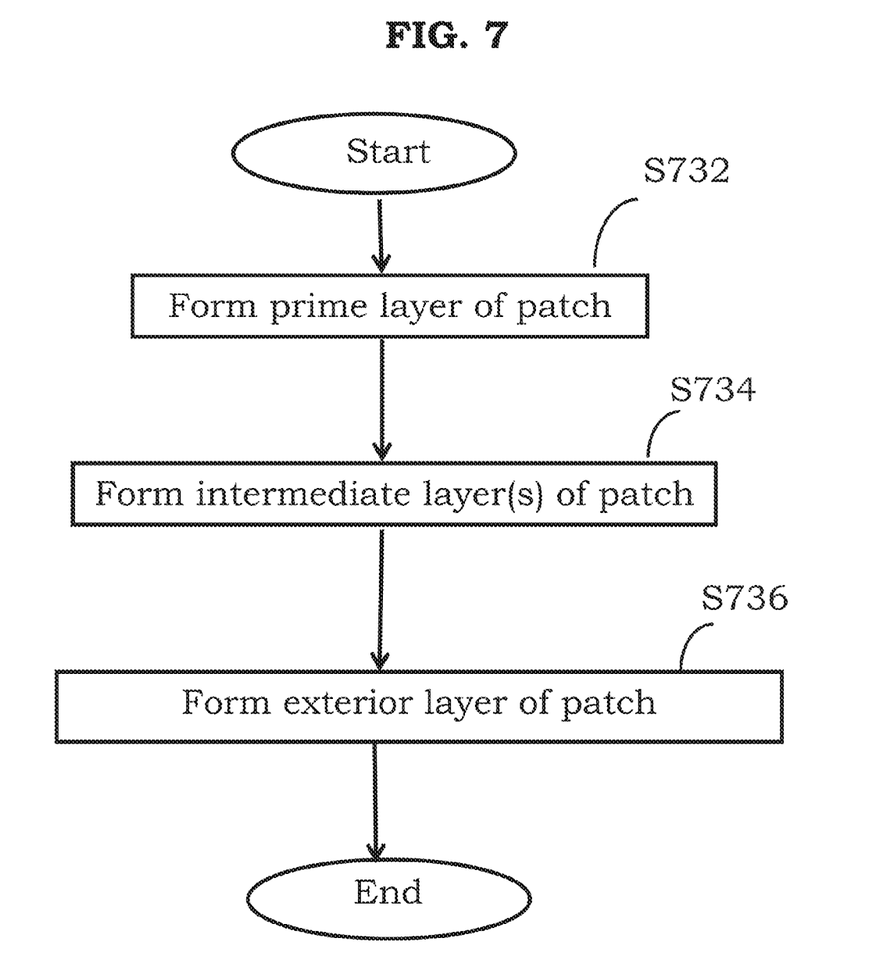
FIG. 7 is a flow chart illustrating a modified example of the forming a patch operation in a method of applying a coating to a defect area of a workpiece according to an example embodiment.

FIG. 6A illustrates a primer layer including spot material portions formed on a defect area using a friction-spot sealing process according to an example embodiment. FIGS. 6B and 6C illustrate a patch including a plurality of layers according to an example embodiment. FIG. 7 is a flow chart illustrating a modified example of the forming a patch operation in a method of applying a coating to a defect area of a workpiece according to an example embodiment.

Referring to FIGS. 5 and 7, the forming the patch operation S530 in FIG. 5 may be performed according to operations S732, S734, and S736 in FIG. 7 if the size of the defect area of the workpiece 300 is less than the threshold value in operation S520 of FIG. 5. Then, after operation S734, the method of applying a coating to a defect area may proceed to the optional surface smoothing/stress mitigation (Operation S540) process in FIG. 5.

Referring to FIGS. 6B and 7, if the dimension of the defect area in the workpiece 300 is less than the threshold value (see operation S520 in FIG. 5), then a patch may be formed over at least part of the defect area in the workpiece. The patch may be formed without using a fusion welding process. In an example embodiment, a process for forming the patch P may include forming a primer layer L1 on at least part of the defect area D in the workpiece 300, at least one intermediate layer L2 on the primer layer L1, and an exterior layer L3 on the at least one intermediate layer L2. Although FIG. 6B illustrates one intermediate layer L2, a plurality of intermediate layers may be stacked on top of each other between the primer layer L1 and the exterior layer L3. The patch P may have a length Y that is greater than a length of the defect area D and a width W that is greater than a width of the defect area D. A thickness of the patch P may be equal to the respective thicknesses of the primer layer L1, at least one intermediate layer L2, and exterior layer L3 stacked on top of each other. Each patch P may only cover a partial area of a surface of the workpiece 300 that corresponds to the defect area D or region R in the workpiece 300.

In operation S732, a primer layer L1 that connects to the workpiece 300 and extends over the defect area D may be formed. The primer layer L1 may be formed using a material that has a high bond strength compared to a material of the workpiece 300. For example, the primer layer L1 may have a higher bond strength than the workpiece 300 if the primer layer L1 includes a modified material based on a material of the workpiece 300. For example, a primer layer material with high bond strength could be one with a nominally low yield strength composition and/or microstructure (such as low carbon versions of a given alloy or fully annealed material) that can more readily deform (splat) into roughness valleys of the workpiece 300 to provide an improved interlocking interface, and therefore increase the bond strength. However, example embodiments are not limited thereto. The primer layer L1 may be formed using the plasma coating process described above with reference to operation S530 of FIG. 5. Alternatively, the primer layer may be formed using a non-plasma method without using a fusion-welding process.

Next, in operation S734, at least one intermediate layer L2 may be formed on the primer layer L1. The forming at least one intermediate layer L2 may include forming a first coating layer on the primer layer using the plasma-spray coating process described with reference to operation S530 and FIG. 5 and a first coating material. The first coating material may be at least part of the coating material used for forming the patch P. The first coating material may include a material that has greater strain compliance than the primer layer L1. For example, the first coating material may have greater strain compliance than a material of the primer layer L1 if the first coating material has a fine spray particle size and/or a small crystallographic grain size compared to the material of the primer layer L1. The material of the primer layer L1 may be different than the first coating material. During operation S734, a plurality of coating layers may be formed on the primer layer using the plasma-spray coating process. The plurality of coating layers may be formed of different materials.

Next, in operation S736, an exterior layer may be formed on the patch using the plasma-spray coating process. For example, a second coating layer may be formed on the first coating layer using the plasma-spray coating process described with reference to operation S530 and FIG. 5 and a second coating material. The second coating material may be at least part of the coating material used for forming the patch P.

In an example embodiment, the at least one intermediate layer L2 may include the first coating layer and the exterior layer L3 may include the second coating layer. As shown in FIG. 6C, the first coating material and the second coating material may have different compositions and/or structures. The first coating material for forming the intermediate layer L2 may include first particles P1 and the second coating material for forming the exterior layer L3 may include second particles P2, where a size of the first particles P1 may be greater than a size of the second particles P2. Alternatively, the at least one intermediate layer L2 in FIG. 6B may include the first coating layer and the second coating layer.

In operation S732, the primer layer may be formed using a non-plasma method without using a fusion-welding process. For example, referring to FIG. 6A, a primer layer including a plurality of spot material portions (e.g., S1 to S3) bonded to a plurality of positions (e.g., P1 to P3) of the workpiece 300 may be formed over a defect area D in the workpiece 300. The defect area D in FIG. 6A may correspond to the gap, crack, opening, or region R described above in the workpieces 300 illustrated in FIGS. 3A to 3D. The primer layer including the spot material portions (e.g., S1 to S3) may be formed using a friction-sealing process. The primer layer L1 may correspond to the primer layer including the spot material portions (e.g., S1 to S3) in FIG. 6A.

The forming the primer layer including spot material portions (e.g., S1 to S3) may include forming a first spot material portion S1 on the workpiece 300 by moving the consumable structure 260 to contact a first position P1 of the workpiece 300 for a first period of time while applying a first axial force to the consumable structure and at least one of rotating the consumable structure 260 at a first rotational speed and oscillating the consumable structure 260 at a first frequency so a first part of the consumable structure 260 bonds to the first position P1 of the workpiece while the first position P1 of the workpiece 300. Then, a remaining portion of the consumable structure 260 may be moved away from the first position P1 of the workpiece 300 to face a second position P2 of the workpiece 300. Next, the primer layer may include forming a second spot material portion S2 on the workpiece 300 by moving the remaining portion of the consumable structure 260 to contact the second position P2 of the workpiece 300 for a second period of time while applying a second axial force to the remaining portion of the consumable structure 260 and at least one rotating the remaining portion of the consumable structure 260 at a second rotational speed and oscillating the consumable structure 260 at a second frequency so a second part of the consumable structure 260 bonds to the second position of the workpiece 300. The first and second positions P1 and P2 of the workpiece 300 are different positions and include a portion of the defect area D such that at least one of the first and second spot material portions P1 and P2 overlaps at least part of the defect area D. The third spot material portion S3 may be formed using the using the same friction-sealing method on the third position P3 of the workpiece 300. The primer layer may be formed while the workpiece 300 is submerged under a liquid L. Although FIG. 5A illustrates a primer layer that includes three spot material portions S1 to S3, one or ordinary skill in the art would understand that the primer layer may be formed to include more or fewer than 3 spot material portions. Also, the primer layer may include multiple columns of spot material portions.

The apparatus 200' described above in FIG. 3C may be used to form the primer layer including spot material portions (e.g., S1 to S3) on the workpiece 300 at the defect area D. However, one of ordinary skill in the art would appreciate that the primer layer including spot material portions (e.g., S1 to S3) may be formed differently. For example, a diver could use a drill-like machine (e.g., a machine including a motor for rotating and/or oscillating a consumable structure, power circuitry for powering motor, control logic, and a chuck for securing the consumable structure) to form spot material portions (e.g., S1 to S3) on the workpiece 300. Using a drill-like machine, the diver could couple the consumable structure to the drill-like machine using the chuck, at least one of rotate and oscillate the consumable structure using the motor, and form a plurality of spot material portions bonded a plurality of positions of the workpiece. The plurality of spot material portions may be formed by manually pressing the consumable structure against different locations of the workpiece while the drill-like machine is used to at least one of rotate and oscillate the consumable structure 260.

The plurality of spot material portions may form a pattern that overlaps the defect area. Each one of the plurality of spot material portions may overlap at least one other spot material portion among the plurality of spot material portions. A width and a length of the pattern of spot material portions may be greater than a width and a length of the defect area D. A thickness of the spot material portions (e.g., S1 to S3) may be in a range of 0.1 mm to 10 mm (and/or 1.0 to 6.0 mm). A width of the spot material portions (e.g., S1 to S3) may be in a range of 1 mm to 250 mm However, example embodiments are not limited thereto and the thickness and widths of the spot material portions may vary.

While a number of example embodiments have been disclosed herein, it should be understood that other variations may be possible. Such variations are not to be regarded as a departure from the spirit and scope of the present disclosure, and all such modifications as would be obvious to one skilled in the art are intended to be included within the scope of the following claims.

The invention claimed is:

1. A method for applying a coating to a defect area of a reactor component, the method comprising:
   arranging a plasma gun to face a region of the reactor component that includes at least a portion of the defect area such that the plasma gun and the region of the reactor component are separated by a desired distance;
   forming a patch on the reactor component at the defect area using a plasma-spray coating process, the plasma-spray coating process including, grounding the reactor component and a power supply of the plasma gun to a common ground such that a potential difference exists between the reactor component and a cathode of the plasma gun, directing an ion-etching stream and a coating stream towards the region of the reactor component using the plasma gun while maintaining the desired distance between the plasma gun and the region of the reactor component, the directing the ion-etching stream and the coating stream being performed concurrently, the directing the ion-etching stream including heating the region of the reactor component using a plasma stream exiting a spray nozzle of the plasma gun, and the directing the coating stream including transferring droplets of a coating material injected into the plasma gun to impinge the region of the reactor component.

2. The method of claim 1, wherein
a thickness of the patch is in a range of 0.1 mm to 100 mm,
a width of the patch is in a range of 1 mm to 250 mm.

3. The method of claim 1, wherein the forming the patch is performed without at least one of using a fusion-welding process and forming a gas shroud.

4. The method of claim 1, wherein
the reactor component is an internal reactor component for use inside a nuclear reactor, and
the reactor component has been highly irradiated.

5. The method of claim 1, wherein the coating material includes at least one metal.

6. The method of claim 5, wherein the at least one metal includes a noble metal.

7. The method of claim 5, wherein
the forming the patch includes performing the plasma spray process so the directing the ion-etching stream heats the reactor component to a temperature below a melting point of the reactor component.

8. The method of claim 5, wherein
the reactor component includes at least one of stainless steel, carbon steel, nickel-based steel, low-alloy steel, chromium-based steel, austenitic steel, or duplex steel,
the forming the patch includes,
forming a primer layer that connects to the reactor component and extends over the defect area, and
forming a first coating layer on the primer layer using the plasma-spray coating process and a first coating material, the first coating material is at least a part of the coating material,
the primer layer is formed using a material that has a high bond strength to a material of the reactor component,
the first coating material includes a material that has greater strain compliance than the primer layer, and
the material of the primer layer is different than the first coating material.

9. The method of claim 8, wherein the forming the patch includes forming the primer layer using a non-plasma method without using a fusion-welding process.

10. The method of claim 9, wherein the forming the patch includes forming the primer layer using a friction-welding process.

11. The method of claim 8, wherein
the forming the patch includes forming a second coating layer on the first coating layer using the plasma-spray coating process and a second coating material, the second coating material is at least a part of the coating material, and
the first coating material and the second coating material have different compositions.

12. The method of claim 11, wherein
the first coating material includes first particles and the second coating material includes second particles, and
a size of the first particles is greater than a size of the second particles.

13. The method of claim 1, wherein
the defect area is one of a crack, a gap, and a hole defined in the reactor component, and
the forming the patch includes forming the patch to have a pattern that corresponds to a shape of the defect area.

14. The method of claim 1, wherein
the region of the reactor component includes a higher density of defects compared to a portion of the reactor component outside of the region of the reactor component, and
the forming the patch includes forming the patch on an external surface of the region of the reactor component without forming the patch on an external surface of the portion of the reactor component outside of the region.

15. The method of claim 1, wherein the desired distance is in a range of about 10 mm to about 20 mm.

16. The method of claim 1, wherein the reactor component is one of a shroud or a steam separator.

17. The method of claim 1, further comprising:
performing a stress mitigation process on the patch, wherein
the stress mitigation process includes improving a surface finish of the patch using one of, a sanding, and a surface-treatment process.

18. A method for applying a coating on a workpiece using a plasma gun to reduce leakage through a defect area defined in the workpiece, the method comprising:
grounding the workpiece and a power supply of the plasma gun to a common ground such that a potential difference exists between the workpiece and a cathode of the plasma gun;
arranging the plasma gun to face a region of the workpiece that is separated by a distance sufficiently short that the plasma gun is configured to generate a plasma stream that exits the plasma gun during plasma gun operation and will impinge directly on a surface of the region of the workpiece, the region of the workpiece including at least a portion of the defect area;
ion etching the surface of the region of the workpiece by heating the surface with the plasma stream exiting a spray nozzle of the plasma gun to transform oxide-forming atoms on the surface of the region of the workpiece into positive ions,
the distance separating the plasma gun and the workpiece being such that the positive ions leave the surface of the region of the workpiece under the influence of the potential difference between the region of the workpiece and the cathode; and
splattering the surface of the region of the workpiece with droplets of coating material injected into the plasma gun, the ion etching and splattering the surface being performed concurrently with maintaining the potential difference between the workpiece and the cathode.

* * * * *